United States Patent [19]

Hanson et al.

[11] Patent Number: 5,472,516
[45] Date of Patent: Dec. 5, 1995

[54] PROCESS AND APPARATUS FOR SEMICONDUCTOR DEVICE FABRICATION

[75] Inventors: Karrie J. Hanson, Westfield; Gregg S. Higashi; Joseph M. Rosamilia, both of Berkeley Heights, all of N.J.

[73] Assignee: AT&T Corp., Murray Hill, N.J.

[21] Appl. No.: 228,336

[22] Filed: Apr. 15, 1994

[51] Int. Cl.⁶ .................................................. B08B 7/04
[52] U.S. Cl. ..................................... 134/18; 134/2; 134/3
[58] Field of Search ....................................... 134/2, 3, 18

[56] References Cited

U.S. PATENT DOCUMENTS 5,176,756  1/1993  Nakashima et al. ................. 134/2

FOREIGN PATENT DOCUMENTS 59-46032  of 1984  Japan.
62-8040   of 1987  Japan.

OTHER PUBLICATIONS

W. Kern, "The Evolution of Silicon Wafer Cleaning Technology," *J. Electrochem. Soc.*, 137(6):1887 (1990).
M. Meuris, et al. "The Relationship of the Silicon Surface Roughness and Gate Oxide Integrity in $NH_4OH/H_2O_2$ Mixtures," *Jpn. J. Appl. Phys.* 31 (Part 2, No. 11A): L1514 (1992).
H. Kobayashi, et al. "Study of Si Etch Rate in Various Compositions of SCI Solution," *Jpn. J. Appl. Phys.*, 32 (Pt. 2, No. 1A/B):L45 (1992).
I. Takahashi, et al "Time–Dependent Variation of Composition of SCI Solution," *Jpn. J. Appl. Phys.* vol. 32, pp. L1183–L1185 (1993).

*Primary Examiner*—John Sheehan
*Attorney, Agent, or Firm*—Richard J. Botos

[57] ABSTRACT

A method and apparatus for cleaning substrates in a process for device fabrication is disclosed. An aqueous solution of hydrogen peroxide and ammonium hydroxide is used to clean the substrates. The concentration of hydrogen peroxide and ammonium hydroxide in the cleaning solution is maintained at a certain level. The life of the cleaning solution is extended by the process. By maintaining the concentrations of the hydrogen peroxide and ammonium hydroxide in the solution within a desired range, the process also provides a cleaning solution that effectively cleans the substates throughout the entire time the solution is used to clean the substrates. The apparatus monitors certain solution parameters such as the pH and the conductivity of the cleaning solution and adds hydrogen peroxide and/or ammonium hydroxide to the cleaning solution to maintain the parameters, and thus the concentration of hydrogen peroxide and ammonium hydroxide, at desired levels.

8 Claims, 2 Drawing Sheets

PROCESS AND APPARATUS FOR SEMICONDUCTOR DEVICE FABRICATION

BACKGROUND OF THE INVENTION

1. Technical Field

The present invention is directed to a process for device fabrication. The present invention relates to that aspect of the process in which the device substrate is cleaned during fabrication.

2. Art Background

In device fabrication, it is becoming increasingly important to remove impurities such as particles, contaminated films, and adsorbed gases from the surface of the substrate during device fabrication. One way in which impurities are removed from substrates is by rinsing the substrate with a solution containing deionized water, ammonium hydroxide, and hydrogen peroxide. As observed in Kern, W., "The Evolution of Silicon Wafer Cleaning Technology," *J. Electrochem. Soc.*, 137(6):1887 (1990), the substrate is rinsed with this solution using many different techniques such as immersion in a bath, spray cleaning and megasonic cleaning. A bath containing such a solution is described in U.S. Pat. No. 5,167,756 to Nakashima et al.

As observed in M. Meuris, et al., "The Relationship of the Silicon Surface Roughness and Gate Oxide Integrity in $NH_4OH/H_2O_2$ Mixtures," *Jpn. J. Appl. phys.*, 31 (Part 2, No. 11A): L1514 (1992) a small variation in the amount of ammonium hydroxide in the bath will affect both the efficiency with which the bath cleans semiconductor substrates and capacitor yield on those substrates. Furthermore, as observed in Kobayashi, H., et al., "Study of Si Etch Rate in Various Compositions of SC1 Solution," *Jpn. J. Appl. phys.*, 32(Pt. 2, No. 1A/B):L45 (1992) the concentrations of ammonium hydroxide and hydrogen peroxide affect the rate at which the cleaning solution etches the semiconductor substrate.

A standard cleaning solution has an ammonium hydroxide concentration of about 0.01 to about 10 percent by weight of cleaning solution and a hydrogen peroxide concentration of about 0.01 to about 10 percent by weight of cleaning solution. However, ammonia evaporates from the solution and hydrogen peroxide decomposes over time and, therefore, the concentrations of ammonium hydroxide and hydrogen peroxide in the cleaning solution are not constant over time. Eventually, the concentrations of ammonium hydroxide and hydrogen peroxide change so much that the solution is no longer useful for cleaning substrates. Substrates such as silicon wafers, flat panels, and photomasks are therefore typically cleaned by a batch process in which the solution is discarded when it is no longer useful because the concentrations of ammonium hydroxide or hydrogen peroxide are no longer within the desired range.

Although this batch approach has high costs associated with reduced production throughput (because the time it takes to change the solution is time in which substrates are not being cleaned) and chemical use and disposal, there is currently no commercial process for controlling the concentration of ammonium hydroxide and hydrogen peroxide in the bath over time as the bath is used to clean substrates. Although control schemes are described in Japanese Patent Application No. SHO 59[1984]-46032 to Harasono et al. and Japanese Patent Application No. SHO 62[1987]-8040 to Miyabi et al., these control schemes do not control both the concentration of ammonium hydroxide and the concentration of hydrogen peroxide in the cleaning solution and therefore do not provide a mechanism for significantly extending the useful life of the bath. A process for cleaning substrates in which the concentrations of both ammonium hydroxide and hydrogen peroxide are controlled such that they are maintained within a desired concentration range as the bath is used to clean substrates is therefore desired.

SUMMARY OF THE INVENTION

The present invention is directed to a process for cleaning substrates, typically substrates that are used in semiconductor device fabrication. An aqueous solution containing ammonium hydroxide and hydrogen peroxide is used to clean the substrate. The present process controls the concentrations of the hydrogen peroxide and the ammonium hydroxide in the solution within a desired range as the solution is used to clean substrates. It is advantageous if the concentrations of hydrogen peroxide and ammonium hydroxide are each about 0.01 to about 10 weight percent of the aqueous solution.

The hydrogen peroxide and ammonium hydroxide dissociate into certain ionic species in the bath. The hydrogen peroxide (a weak acid with a pK at 25° C. of 11.62) and the ammonium hydroxide (a weak base with a pK at 25° C. of 4.75) each has its own dissociation constant in an aqueous solution. If the concentration of one of certain pairs of species in the bath are known, the concentrations of ammonium hydroxide and hydrogen peroxide are determinable. These species pairs are $H_2O_2$ and $HO_2^-$; $H_2O_2$ and $OH^-$; $H_2O_2$ and $NH_4OH$; $H_2O_2$ and $NH_4^+$; $H_2O_2$ and $H^+$; $NH_4OH$ and $HO_2^-$; $NH_4OH$ and $OH^-$; $NH_4OH$ and $H^+$; $NH_4OH$ and $NH_4^+$; $HO_2^-$ and $OH^-$; $HO_2^-$ and $H^+$; $NH_4^+$ and $OH^-$, and $NH_4^+$ and $H^+$.

Once the desired species pair is selected, sensors that detect the concentration of these species are selected. For example, if the species pair $HO_2^-$ and $H^+$ is selected, $[HO_2^-]$ is determined by measuring conductivity of the solution and $[H^+]$ is determined by measuring the pH of the solution. For convenience, brackets are used to denote concentration. These parameters are selected because pH directly measures $[H^+]$ and conductivity is related to the concentration of charged species (e.g. $HO_2^-$) in the solution. Based upon the principal of charge conservation and the relative concentrations of the various charged species in the solution, conductivity provides a direct measurement of $[HO_2^-]$ and $[NH_4^+]$ in the solution. Typically, the pH of the aqueous solution is about 9 to about 11. It is advantageous if the pH of the solution is maintained within this range during the cleaning process. It is also advantageous if the conductivity of the solution is maintained within about twenty percent of the solution conductivity at the time the solution (with the desired concentrations of hydrogen peroxide and ammonium hydroxide) was prepared.

The measured parameters are used to control the concentration of hydrogen peroxide and ammonium hydroxide in the aqueous solution. A flow diagram for controlling the composition of the bath by monitoring the conductivity and pH of the bath is illustrated in FIG. 1.

The present invention is also embodied by an apparatus that monitors the pH and the conductivity of the cleaning solution. The apparatus also maintains the desired concentration of hydrogen peroxide and ammonium hydroxide by adding one or both of these ingredients to the cleaning solution to maintain the pH and the conductivity at levels that are associated with the desired concentrations of these ingredients in the aqueous solution.

DETAILED DESCRIPTION

Figure 1:
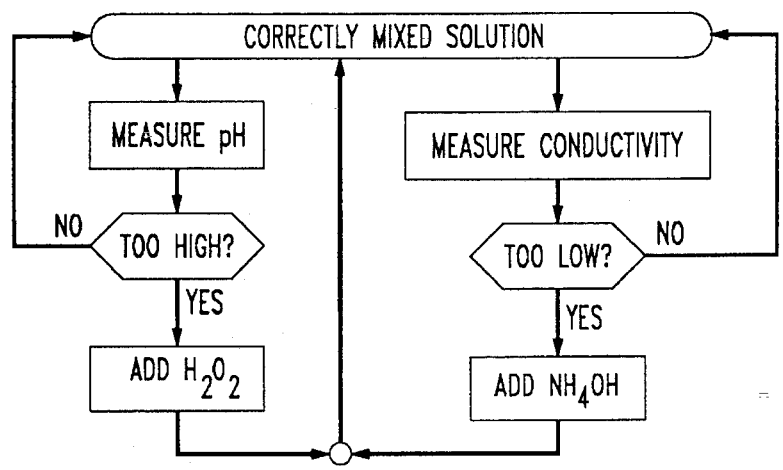
FIG. 1 is an illustration of the control scheme of the present invention.

Impurities on substrates such as a semiconductor substrates, multichip modules, masks used for semiconductor processing, and flat panel displays are removed because the presence of these impurities adversely affects device yield and performance. One way in which such impurities are removed is to subject the substrate to an aqueous solution of hydrogen peroxide and ammonium hydroxide. The substrate is subjected to the aqueous solution using techniques such as immersion, centrifugal spray cleaning, megasonic cleaning and closed system chemical cleaning. Such a solution, which is commonly known as the RCA standard clean, is well known for this purpose. The RCA standard clean process is described in the previously mentioned article entitled "The Evolution of Silicon Wafer Cleaning Technology" by W. Kern, which is hereby incorporated by reference.

For the rinsing solution to effectively clean the surface of the substrate, the concentrations of both ammonium hydroxide and hydrogen peroxide are each about 0.01 to about 10 percent by weight of the solution. The concentrations of ammonium hydroxide and hydrogen peroxide in these baths vary widely, depending upon the specific application. One skilled in the art will appreciate that solutions with higher concentrations of ammonium hydroxide and lower concentrations of hydrogen peroxide will have a greater tendency to etch the substrate surface than solutions with lower concentrations of ammonium hydroxide and higher concentrations of hydrogen peroxide.

The concentrations of ammonium hydroxide and hydrogen peroxide in the bath also change over time. The change in concentration is caused by the evaporation of ammonia from the solution and the decomposition of the hydrogen peroxide in the solution. The rate of hydrogen peroxide decomposition increases as metals and other impurities build up in the solution.

In the process of the present invention, a cleaning solution of aqueous ammonium hydroxide (about 0.01 to about 10 percent by weight of the solution) and hydrogen peroxide (about 0.01 to about 10 percent by weight of the solution) is prepared. It is advantageous if the concentration of ammonium hydroxide in solution is about 0.3 to about 0.8 weight percent of the solution and the concentration of hydrogen peroxide in solution is about 2.5 to about 3.5 weight percent of the solution. The solution is then used to clean substrates such as semiconductor substrates, flat panel displays and the like. The substrates are cleaned by contacting the substrates with the solution by any suitable technique, such as by immersing them in a bath of the solution or by rinsing them with the solution. It is advantageous if the bath is agitated as the substrates are being cleaned. The amount of time the substrate is cleaned is largely a matter of design choice.

In this process, ammonium hydroxide and hydrogen peroxide are metered into the solution to maintain the concentration of these components at the desired level. The process significantly prolongs the use of a single batch of the cleaning solution, thereby reducing the costs associated with replacing the cleaning solution, such as the loss in production throughput associated with replacing the cleaning solution and the costs of disposing of the spent solution.

The process controls the concentrations of ammonium hydroxide and hydrogen peroxide in the bath by monitoring the concentration of certain pairs of species in the solution. The concentrations of these species pairs are relatable to the concentration of ammonium hydroxide and hydrogen peroxide in the solution because the hydrogen peroxide and ammonium hydroxide have an equilibrium relationship with certain species in the bath. Hydrogen peroxide and ammonium hydroxide partially dissociate in aqueous solutions. The dissociation constant (k), which is a function of temperature, indicates that degree of dissociation at the solution temperature. When used to clean substrates, the solution temperature is typically about ambient to about 85° C. Although the process of the present invention controls the concentration of ammonium hydroxide and hydrogen peroxide in the cleaning solution through the entire temperature range, it is advantageous if the solution temperature is about ambient to about 70° C. For ammonium hydroxide, the dissociation constant ($k_1$) is about $10^{-5}$ and is defined by the relationship:

$$[NH_4^+][OH^-]/[NH_4OH] = k_1 \cong 1 \times 10^{-5} \qquad (1)$$

For hydrogen peroxide, the dissociation constant ($k_2$) is about $10^{-12}$ and is defined by the relationship:

$$[H^+][HO_2^-]/[H_2O_2] = k_2 \cong 1 \times 10^{-12} \qquad (2)$$

Since the hydrogen peroxide and ammonium hydroxide are a weak acid and a weak base, respectively, the acid/base reaction is affected by the dissociation of water. The dissociation constant for water ($k_3$) is about $10^{-4}$ and is defined by the relationship:

$$[H^+][OH^-] = k_3 \cong 1 \times 10^{-14} \qquad (3)$$

Combining the above expressions provides the following relationships:

$$[H_2O_2] = k_3[HO_2^-]/k_2[OH^-]; \text{ and} \qquad (4)$$

$$[NH_4OH] = 1/k_1[OH^-][NH_4^+]. \qquad (5)$$

Also, the principal of charge conservation dictates that the concentration of positive ions and negative ions in a neutral solution be equal and thus:

$$[NH_4^+] + [H^+] = [HO_2^-] + [OH^-] \qquad (6)$$

In the solutions contemplated as useful in the process of the present invention, the equilibrium constants establish that the concentrations of $NH_4^+$ and $HO_2^-$ are at least one order of magnitude larger than the concentrations of $H^+$ or $OH^-$. If $[H^+]$ and $[OH^-]$ are cancelled out of equation 6 for this reason, the concentrations of $NH_4^+$ and $HO_2^-$ are approximately equal in the bath.

Assuming that $[NH_4^+] \cong [HO_2^-]$ in the solution, the above equations are used to control the concentrations of ammonium hydroxide and hydrogen peroxide in the solution by monitoring the concentrations of one selected pair of species in the solution. The species pair is not selected at random, but is selected for the purpose of determining the concentrations of other components in the bath. Since the objective is to control the concentration of ammonium hydroxide and hydrogen peroxide in the bath, the species pair is selected so that the concentrations of these two components is determinable. These species pairs are $H_2O_2$ and $HO_2^-$; $H_2O_2$ and $OH^-$; $H_2O_2$ and $NH_4OH$; $H_2O_2$ and $NH_4^+$; $NH_4OH$ and $OH^-$; $NH_4OH$ and $H^+$; $NH_4OH$ and $NH_4^+$; $HO_2^-$ and $OH^-$; $HO_2^-$ and $H^+$; $NH_4^+$ and $OH^-$; and $NH_4^+$ and $H^+$.

Sensors are then selected to monitor the concentration of the relevant species pair. Although $H_2O_2$ and $NH_4OH$ are enumerated among the species pairs that are monitored to effect control, it is more difficult to monitor the concentrations of these species in the solution because they are neutral. It is advantageous to monitor the charged pairs of species such as $HO_2^-$ and $H^+$, $NH_4^+$ and $OH^-$; etc.

For example, if the species pair $HO_2^-$ and $H^+$ are selected, sensors such as a conductivity sensor and a pH meter, respectively, will monitor their concentration. pH is monitored because it is a direct measure of $[H^+]$. Conductivity is measured because it indicates the total number of ions in solution as a function of their respective mobility. As stated previously, $[HO_2^-]$ and $[NH_4^+]$ are approximately equal in these solutions. The mobility of these ions is also approximately equal. Consequently, conductivity is a direct measure of both $[HO_2^-]$ and $[NH_4^+]$.

Once the sensors for measuring the concentration of the particular species pair are selected, the range of sensor readings that correspond to desired concentrations of ammonium hydroxide and hydrogen peroxide in the bath are determined. For example, if the selected sensors are pH and conductivity sensors, the range of solution conductivity and the range of solution pH associated with solutions with the desired concentrations of ammonium hydroxide and hydrogen peroxide is determined. For example, in an aqueous solution with an ammonium hydroxide concentration of about 0.3 to about 0.5 weight percent based on the weight of the solution and a hydrogen peroxide concentration of about 2.5 to about 3 weight percent based on the weight of the solution, the conductivity is about 5 mmhos/cm to about 50 mmhos/cm (at a solution temperature of 75° C.) and the pH is about 9.8 to about 10.2. One skilled in the art will appreciate that solution conductivity varies with solution temperature.

As shown in FIG. 1, the pH and conductivity are controlled by adding either ammonium hydroxide or hydrogen peroxide to the bath if the conductivity or pH, respectively, are not within a set range of values. For example, if the conductivity of the solution falls below the desired level, ammonium hydroxide is added until the conductivity returns to the desired level. Similarly, if the solution pH is above the desired range, the controller flows hydrogen peroxide into the solution to lower the pH to the desired level. Typically ammonium hydroxide is added to the solution either by introducing ammonia gas directly into the solution or by adding aqueous ammonium hydroxide to the solution. Hydrogen peroxide is added to the solution by metering an aqueous solution of hydrogen peroxide into the solution.

However, this description of the control scheme assumes that the conductivity and pH meters are calibrated. It is also contemplated that uncalibrated sensors will be used to simply monitor changes in solution pH and conductivity. Using the pH and conductivity of the freshly made solution as a baseline, the composition of the solution is controlled by monitoring periodically the pH and conductivity of the solution. If the pH and conductivity are different from the baseline values by more than an acceptable amount, either ammonium hydroxide or hydrogen peroxide is added to the solution to restore the conductivity and/or pH to approximately the baseline value. In this regard, it is advantageous if the conductivity of the solution is maintained within about twenty percent, and preferably about five percent, of the baseline value and the pH is maintained within about five percent of the baseline value.

One skilled in the art will also appreciate that the baseline values and setpoints in the process are susceptible to variation. The process controls the concentration of ammonium hydroxide and hydrogen peroxide by monitoring the solution parameters, e.g. pH and conductivity, and adding hydrogen peroxide and ammonium hydroxide to the solution in response to a change in the parameters. Thus, it is the change in the parameter, and not its absolute value, that provides the basis for control.

Example 1

Figure 2:
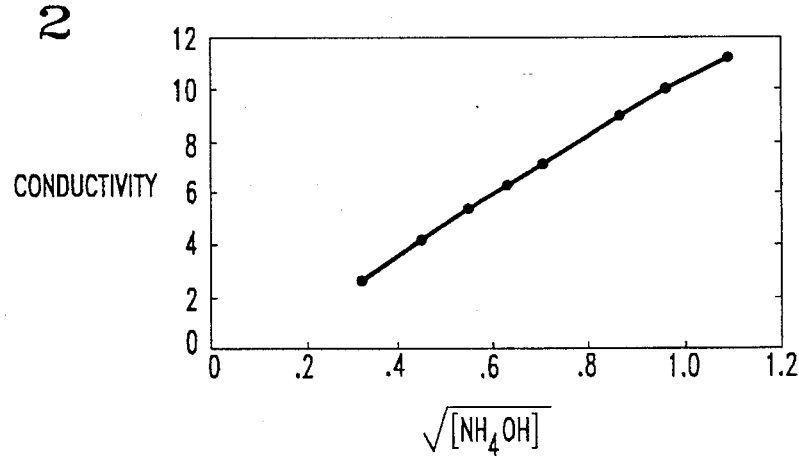
FIG. 2 is a graph illustrating the relationship between the concentration of ammonium hydroxide in a semiconductor cleaning bath and the conductivity of the cleaning bath.

The effectiveness of this control scheme is illustrated in FIG. 2. A solution of 4 L of $H_2O_2$ (30 percent by weight) and 28 L of $H_2O$ was prepared. The conductivity of the solution was monitored as ammonium hydroxide was metered into it. FIG. 2 illustrates a straight line relationship exists between the conductivity and the square root of the concentration of ammonium hydroxide. This same mathematical relationship is provided by assuming that $[NH_4^+] \cong [HO_2^-]$ and solving equations 1–5 for $[HO_2^-]$. The resulting equation:

$$[NH_4^+] \cong [HO_2^-] = \sqrt{\frac{k_1 k_2}{k_3} [H_2O_2][NH_4OH]} \quad (7)$$

indicates a square root relationship between $[NH_4OH]$ and $[HO_2^-]$. Since $[HO_2^-]$ is measured by conductivity, FIG. 2 reflects the relationship described by equation (7).

Other sensors which are contemplated as useful for sensing the concentration of a relevant species in the process of the present invention include ion selective electrodes and redox couple probes. One skilled in the art will also appreciate that there are a variety of techniques that will measure the concentration of a relevant species in the solution. Examples of these techniques include UV absorption spectroscopy, amperometric measurement; on-line titration, on-line ion chromatography; and Raman Spectroscopy. One skilled in the art will appreciate which sensor or technique to select to measure the concentration of a particular species in the bath. However, it is advantageous to select sensors that measure ionic species in the solution, because these charged species are more susceptible to accurate measurement.

By monitoring the amount of hydrogen peroxide metered into the solution as a function of time, one can also monitor the build up of impurities in the solution. For example, if the amount of peroxide added to the solution described in Example 1 during the first few hours of its use is about 1 L/hr and it increases to about 2 L/hr about 10 hours later, the substantial increase in the rate at which the peroxide is being added indicates that the peroxide is being catalyzed by the metal in the bath at a much faster rate than when the bath was fresh. This indicates that there is such a high concentration of the metallic impurities in the bath that the bath must be replaced by a fresh solution.

Typically, the cleaning solution will be disposed of because of a buildup of impurities from the washed substrates. However, it is contemplated that the bath life will be extended indefinitely if the bath is continuously drained and replenished at a steady state. In addition to the ammonium hydroxide and hydrogen peroxide that are added to the bath in response to a change in bath conditions observed by the controller, a small portion of the used bath will be continuously drained from the bath while streams of aqueous hydrogen peroxide, aqueous ammonium hydroxide and water are metered into the bath. If the components are metered in as a single stream, the concentration of the components in the stream approximate the concentration of the components in the solution being drained from the bath. If the components are metered in as separate streams, the rate and composition of each stream is controlled to ensure that the combined streams approximate, in both composition and rate, the solution being drained from the bath.

Example 2

Cleaning semiconductor substrates according to the Process of the Present Invention A SubMicron Systems automated wet-bench equipped with a recirculating 400 W, 0.9 MHz fused-silica SC1-megasonic tank, a fused-silica quick-dump-rinse/overflow-cascade-rinse tank was used to rinse semiconductor substrates. An aqueous cleaning solution of hydrogen peroxide (2.8 percent by weight) and ammonium hydroxide (0.3 percent weigh) was prepared. The solution was prepared in the automated wet-bench.

The conductivity of the solution was measured using an in-line inductively-coupled if-sensor which was integrated with a system for dispensing gaseous ammonia. The pH of the solution was measured by a standard pH probe in a sample stream of the cleaning solution circulated by a peristaltic pump. The measured sample was not returned to the bath. The conductivity of the solution was about 10 mmhos/cm. The reading on the conductivity meter was about 25 for the freshly made solution. The pH of the solution was about 9.8. The concentration of ammonium hydroxide in the bath was determined directly using an ion-selective electrode and the concentration of hydrogen peroxide in the bath was determined directly by permanganate titration.

When the conductivity of the cleaning solution decreased from a reading of about 25 to about 20, gaseous ammonia was added to increase the conductivity to the desired level. When the pH of the solution increased, aqueous hydrogen peroxide (30 percent by weight) was added to reduce the pH to the desired level. The gaseous ammonia was added at a rate of about 4 L/min and the hydrogen peroxide added was added in about 300 ml increments until the desired change in the measured parameter was achieved.

The level of the bath was controlled using a standard level controller. When the level of the solution in the wet-bench dropped below a desired level, water was added to bring the level up to the desired level. The controller continued to monitor and maintain the concentration of ammonium hydroxide and hydrogen peroxide in the bath as described.

Figure 3:
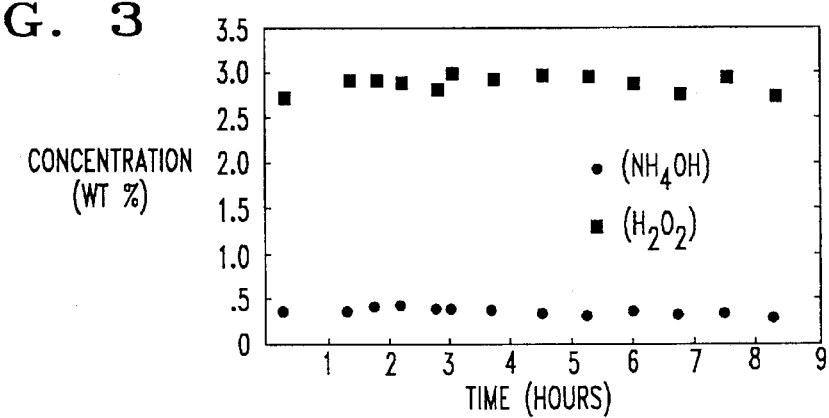
FIG. 3 illustrates the concentration of hydrogen peroxide and the concentration of ammonium hydroxide in a semiconductor cleaning bath over time in the process of the present invention.

As illustrated by FIG. 3, the concentrations of hydrogen peroxide and ammonium hydroxide in the cleaning solution remained relatively constant over an 8 hour period using the process of the present invention. In an identical apparatus in which the concentration of the hydrogen peroxide and the ammonium hydroxide in the cleaning solution is not so controlled, the concentration of the ammonium hydroxide would be reduced to about half the original amount in the first thirty minutes of the cleaning process.

Figure 4:
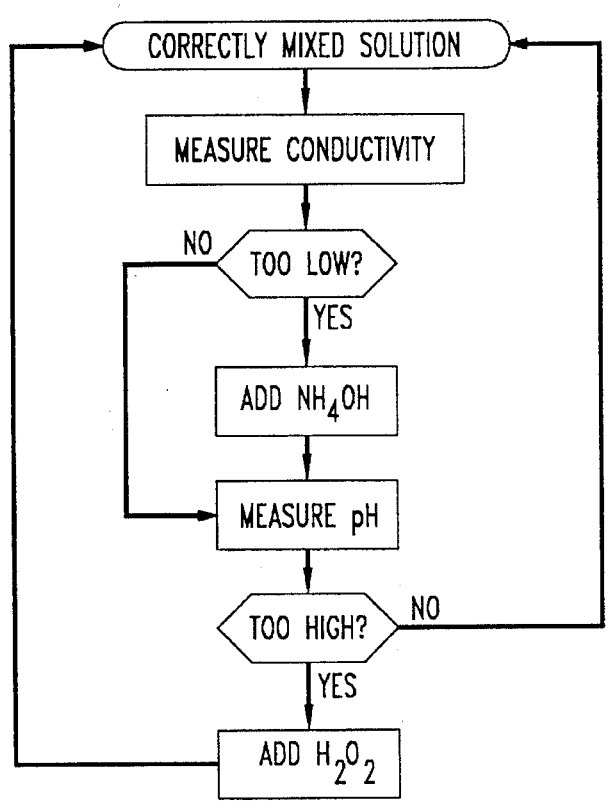
FIG. 4 is an illustration of an alternate control scheme of the present invention.

FIG. 4 depicts a control scheme that is the alternative to that depicted in FIG. 1. This control scheme has a nested loop which requires only one controller. In the process illustrated in FIG. 4, an aqueous solution with a hydrogen peroxide concentration of about 2.5 to about 3 weight percent and an ammonium hydroxide concentration of about 0.3 to about 0.8 weight percent is prepared. As substrates are cleaned in the bath, the conductivity is monitored. If the measured conductivity is too low, an incremental amount of ammonium hydroxide is added.

The pH of the solution is then measured. If the pH is too high, an incremental amount of hydrogen peroxide is added. If the pH is not too high, the control loop begins again. This control loop operates continuously to cause the concentrations of ammonium hydroxide and hydrogen peroxide to converge with their setpoint concentrations.

Figure 5:
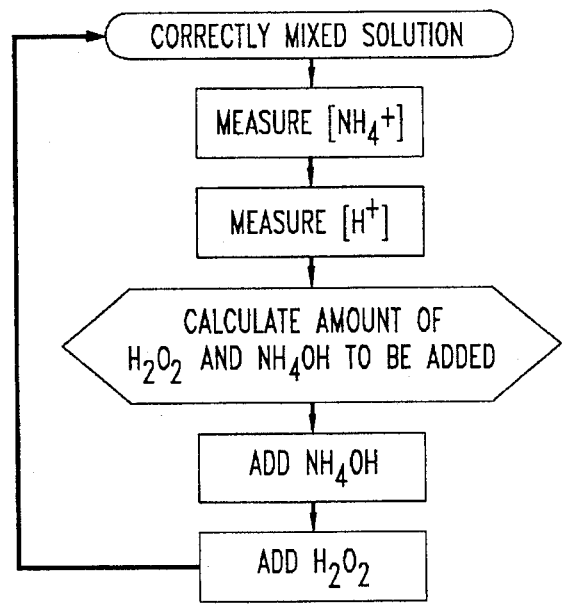
FIG. 5 is an illustration of yet another alternate control scheme of the present invention.

FIG. 5 depicts a control scheme, in which the algorithms described in equations (1)–(6) are used to compute the actual concentrations of ammonium hydroxide and hydrogen peroxide in the solution and to further determine the amount of these ingredients, if any, that must be added to the solution to raise the concentration of these ingredients to the desired level in the bath.

We claim:

1. A process for fabricating a device comprising: cleaning substrates in an aqueous solution of hydrogen peroxide and ammonium hydroxide; measuring a first and a second solution parameter which are a measure of the concentration of a pair of species in the solution which are relatable to the concentration of hydrogen peroxide and ammonium hydroxide in the solution wherein the species pair comprises a member selected from the group consisting of $H_2O_2$ and $HO_2^-$; $H_2O_2$ and $OH^-$; $H_2O_2$ and $NH_4OH$; $H_2O_2$ and $NH_4^+$; $H_2O_2$ and $H^+$; $NH_4OH$ and $HO_2^-$; $NH_4OH$ and $OH^-$; $NH_4OH$ and $H^+$; $NH_4OH$ and $NH_4^+$; $HO_2^-$ and $OH^-$; $HO_2^-$ and $H^+$; $NH_4^+$ and $OH^-$; and $NH_4^+$ and $H^+$ and maintaining the concentration of hydrogen peroxide and ammonium hydroxide in the solution within a desired range based upon the measurement of the parameters.

2. The process of claim 1 wherein the first parameter is the conductivity of the solution and the second parameter is the pH of the solution.

3. The process of claim 2 wherein the pH of a freshly made solution is the baseline pH and the conductivity of the solution is a baseline conductivity and wherein the concentration of hydrogen peroxide is controlled by adding hydrogen peroxide in response to a change in the pH of the solution from the baseline pH and the concentration of ammonium hydroxide is controlled by adding ammonium hydroxide in response to a change in the conductivity of the solution.

4. The process of claim 3 wherein hydrogen peroxide is added to the solution if the pH changes by more than about 5 percent from the baseline pH and ammonium hydroxide is added to the solution if the conductivity changes by more than about 5 percent of the baseline conductivity.

5. The process of claim 3 further comprising determining the build up of impurities in the solution by monitoring the rate of the hydrogen peroxide addition in response to the change in pH.

6. The process of claim 3 further comprising draining a portion of the aqueous solution and replenishing the ammonium hydroxide, hydrogen peroxide and water drained from the solution at about the same rate as they are being drained.

7. The process of claim 1 wherein ammonium hydroxide is added to the solution by introducing gaseous ammonia into the solution.

8. The process of claim 2 wherein the concentrations of hydrogen peroxide and ammonium hydroxide are maintained by measuring the pH and the conductivity of the solution, determining the concentrations of ammonium hydroxide and hydrogen peroxide in the solution from the measured pH and conductivity; comparing the determined concentrations of ammonium hydroxide and hydrogen peroxide with baseline concentrations of ammonium hydroxide and hydrogen peroxide; determining an aliquot of hydrogen peroxide to be added to the solution to change the hydrogen peroxide concentration from the measured concentration to the baseline concentration and adding the aliquot of hydrogen peroxide to the solution; and determining an aliquot of ammonia or ammonium hydroxide to be added to the solution to change the ammonium hydroxide concentration from the measured concentration to the baseline concentration, and adding the aliquot of ammonia or ammonium hydroxide to the solution.

* * * * *